US005789330A

United States Patent [19]
Kondo et al.

[11] Patent Number: 5,789,330
[45] Date of Patent: Aug. 4, 1998

[54] VAPOR DEPOSITION MATERIAL

[75] Inventors: Satoshi Kondo, Yokohama; Yoshitaka Kubota, Sagamihara, both of Japan

[73] Assignee: Tosoh Corporation, Yamaguchi-ken, Japan

[21] Appl. No.: 874,341

[22] Filed: Jun. 13, 1997

[30] Foreign Application Priority Data

Jun. 13, 1996 [JP] Japan .................................. 8-152499

[51] Int. Cl.$^6$ .................................................. C04B 35/48
[52] U.S. Cl. ................................................... 501/103
[58] Field of Search ................................ 501/103, 104, 501/105, 152

[56] References Cited

U.S. PATENT DOCUMENTS 4,742,030  5/1988  Masaki et al. ......................... 501/102
4,923,830  5/1990  Everhart et al. ...................... 501/102

FOREIGN PATENT DOCUMENTS

| 43 02 167 | 2/1994 | Germany . |
| 60-112667 | 6/1985 | Japan . |
| 401290558 | 11/1989 | Japan . |
| 7-82019 | 3/1995 | Japan . |
| 2 216 546 | 10/1989 | United Kingdom . |

Primary Examiner—Paul Marcantoni
Attorney, Agent, or Firm—Sughrue, Mion, Zinn, Macpeak & Seas, PLLC

[57] ABSTRACT

A vapor deposition material which is a sintered body of zirconia containing a stabilizer, wherein the content of monoclinic phase is from 25 to 70%, the content of tetragonal phase is at most 3% and the rest is cubic phase, and of which the bulk density is from 3.0 to 5.0 g/cm$^3$, the porosity is from 15 to 50%, the mode size of pores is from 0.5 to 3 μm, and the volume of pores of from 0.1 to 5 μm constitutes at least 90% of the total pore volume.

4 Claims, No Drawings

VAPOR DEPOSITION MATERIAL

VAPOR DEPOSITION MATERIAL

The present invention relates to a vapor deposition material for coating, which is excellent in heat resistant and thermal shock resistance and capable of forming a stabilized melt pool so that vapor deposition can be carried out.

As a conventional method for forming a thermal barrier coating film, thermal spraying has been common. However, as a result of a recent development of a vapor deposition method, a method for forming a thermal barrier coating film by physical vapor deposition (hereinafter referred to as a PVD method) has been practically employed. Especially an EB-PVD method using an electron beam has attracted an attention, and many methods for forming thermal barrier coating films by an EB-PVD method have been developed as disclosed in ADVANCED MATERIAL & PROCESS, Vol. 140, No. 6, No. 12, p. 18–22 (1991).

Such methods for forming thermal barrier coating films by the EB-PVD method are used for heat resistant coating of parts of e.g. an aircraft engine. A vapor deposition material used for the coating material is required to have excellent heat resistance, since it is coated on a part where a high temperature combustion gas will be in direct contact therewith. Therefore, it is required to have a high melting point and a high purity. Further, it is desired to have good adhesion to a metal part, not to peel by heat cycles, not to be corroded by combustion gas component, to have a low thermal conductivity to increase the durability of a metal part to be protected by this coating and to reduce the surface temperature of the metal part as far as possible. Up to now not many materials have been available which satisfy these requirements, and a sintered body has been mainly used which is obtained by sintering a molded product obtained by molding a zirconia powder containing a stabilizer such as yttria.

Such a vapor deposition material made of a zirconia sintered body containing such a stabilizer has a high melting point and is subjected to film forming by means of an EB-PVD method employing an electron beam capable of evaporating the vapor deposition material with a high energy, since it is necessary to form a vapor deposition film at a high speed.

In this EB-PVD method, an electron beam with a high energy is rapidly irradiated to the above-mentioned vapor deposition material set in a crucible, whereby a usual sintered body undergoes breakage by the thermal shock. If such breakage occurs in the vapor deposition material, there will be a trouble in supplying the vapor deposition material, and a vapor deposition material which undergoes breakage by an electron beam can not practically be used.

Therefore, as a means for solving the problem of breakage due to the thermal shock by this electron beam, vapor deposition materials having various properties have been proposed, and among them, it has been proposed to improve the thermal shock resistance and the heat resistance by making the material porous.

For example, DE4302167C1 discloses a zirconia sintered body which contains from 0.5 to 25 wt % of $Y_2O_3$ and has a density of from 3.0 to 4.5 g/cm$^3$, wherein the content of monoclinic phase is from 5 to 80% and the rest is tetragonal phase or cubic phase. If zirconia is not stabilized, although it is stable in the form of tetragonal phase at a high temperature during heat treatment for the production of a vapor deposition material, it undergoes a phase change from tetragonal phase to monoclinic phase during the temperature drop, and micro cracks will form due to this phase change. Here, it is disclosed that cracking resistance will be improved by the presence of micro cracks due to the presence of this monoclinic phase, and cracking resistance will be improved by increasing the particle size to some extent.

However, if this zirconia sintered body is used for the above application, improvement in heat resistance and thermal shock resistance is inadequate, and cracking is likely to result due to rapid heating by high power EB irradiation, whereby a constant operation for a long period of time will be difficult. The reason is such that even when monoclinic phase is present so that progress of cracking is suppressed by microcracks, or even when the particle size is increased to some extent, sintering may rapidly proceed by rapid heating during EB irradiation depending upon the pore size or upon the mixed state with $Y_2O_3$ serving as a sintering additive, whereby breakage is likely to result due to an excessive stress caused by the shrinkage upon sintering.

As another zirconia sintered body, JP-A-7-82019 proposes a vapor deposition material for heat resistant coating film made of a zirconia porous sintered body which is a sintered body prepared by mixing zirconia particles having a particle size of from 0.1 to 10 μm having a purity of at least 99.8% and yttria particles having a particle size of at most 1 μm, granulating the mixture so that at least 70% of the entirety will be particles having particle sizes of from 45 to 300 μm, followed by heat treatment to sinter zirconia powder particles wherein at least 50% of the entire spherical powder particles is from 45 to 300 μm, whereby the porosity of the sintered body is from 25 to 50%, and a volume of pores having pore sizes of from 0.1 to 5.0 μm constitutes at least 70% of the total pore volume.

As compared with conventional vapor deposition materials, with this material, cracking resistance due to EB irradiation of an EB-PVD method is improved. However, this zirconia sintered body consists of the large particles having broad particle size distribution and the particle shapes are not uniform, whereby the micro structure of the vapor deposition material is non-uniform, and it tends to be difficult to form a stabilized melt pool when the vapor deposition material is melted by EB irradiation to conduct vapor deposition, whereby the film forming operation tends to be difficult, and the durability of the heat resistant coating film formed by vapored position tends to be poor.

It is an object of the present invention to provide a novel vapor deposition material for coating, whereby such problems of the conventional vapor deposition materials have been overcome by improving the thermal shock resistance during EB irradiation, preventing an abrupt boiling phenomenon of the molten liquid melted by EB irradiation, forming a stabilized melt pool and improving the stability of the evaporation rate, and to provide a vapor deposition method wherein such a vapor deposition material is used.

The present inventors have conducted an extensive study to solve such problems and as a result have completed the present invention.

Namely, the present invention provides a vapor deposition material which is a sintered body of zirconia containing a stabilizer, wherein the content of monoclinic phase is from 25 to 70%, the content of tetragonal phase is at most 3% and the rest is cubic phase, and of which the bulk density is from 3.0 to 5.0 g/cm$^3$, the porosity is from 15 to 50%, the mode size of pores is from 0.5 to 3 μm, and the volume of pores of from 0.1 to 5 μm constitutes at least 90% of the total pore volume, and a vapor deposition method wherein such a vapor deposition material is used. By using such a novel vapor deposition material, no cracking will be formed in the material during EB irradiation.

Now, the present invention will be described in detail with reference to the preferred embodiments.

The stabilizer in the present invention may, for example, be yttria, magnesium oxide, calcium oxide, scandium oxide or oxides of Group IIIA 6th periodic rare earth metals (such as lanthanum, cerium, praseodymium, neodymium, promethium, samarium, europium, gadolinium, terbium, dysprosium, formium, erbium, thulium, ytterbium and ruthethium). These stabilizers may be used alone or in combination as a mixture of two or more of them. The stabilizer is added in an amount of from 0.1 to 40 wt %, depending upon the particular purpose.

A part or whole of the stabilizer is solid-solubilized in zirconia. However, if it is completely uniformly solid-solubilized, the crystal particle sizes tend to be too large during heating, whereby thermal shock resistance tends to be impaired, such being undesirable. For example, in a case of a zirconia sintered body having 7.1 wt % of $Y_2O_3$ incorporated, when a sample is subjected to a spot analysis by EPMA randomly at 20 points per sample, and a standard deviation at each point from the feeding composition by wt % of the stabilizer composition is taken, this numerical value is preferably at least 0.45, more preferably at least 0.55. If this numerical value is small, i.e. if the solid solubilization of the stabilizer is uniform, the thermal shock resistance during EB irradiation tends to be low, and the vapor deposition material having such a solid solubilization is not practically useful.

Now, a method for producing the vapor deposition material of the present invention will be described.

A zirconia powder and a stabilizer having an average particle size of from 0.05 to 10 μm are mixed in predetermined amounts and then dispersed and mixed by a mixing apparatus such as a ball mill by means of water or an organic solvent such as ethanol. A starting material powder having a larger particle size may be employed, so long as it can be pulverized by a ball mill so that the final particle size of the vapor deposition material will be within the prescribed range. The mixed slurry is then dried by using a usual drying apparatus such as a spray drier, a reduced pressure drier or a filter press. Further, an organic binder may be added to the slurry to facilitate molding.

A powder containing a zirconia powder and a stabilizer, prepared to obtain the molded product of the present invention, is usually filled in a rubber mold and molded by means of a cold isostatic pressing (CIP) apparatus. The molding pressure is not particularly limited in the present invention.

The molded product thus obtained is usually sintered by heat treatment. This heat treatment temperature is not particularly limited so long as it is at least a temperature for removing the binder or adsorbed substances. It is usually preferably sintered at a temperature of at least 1,000° C., more preferably at least 1,400° C. The molded product before the heat treatment of the present invention has a small shrinkage by heating, and the shrinkage is at a level of 10% at the maximum even when sintered at 1,450° C. Even if the shrinkage is small, if shrinkage starts from a temperature region of about 1,000° C., the region where sintering proceeds by heating during EB irradiation, increases, and the range in which the stress will accordingly be formed, will expand, whereby cracking is likely to take place. Therefore, this sintering is effective to reduce the shrinkage due to a progress of sintering during heating by an electron beam and thus to prevent cracking.

Now, the present invention will be described in further detail. The vapor deposition material of the present invention is primarily made of a sintered body of zirconia containing a stabilizer, and the crystal phase of the sintered body has a content of monoclinic phase of from 25 to 70%, a content of tetragonal phase of at most 3% and the rest being cubic phase. If the content of monoclinic phase is less than 25%, the thermal expansion and the particle size tend to be so large that the thermal shock resistance tends to be impaired. On the other hand, if the content of monoclinic phase exceeds 70%, the volume increase due to the phase transfer tends to be substantial, and formation of cracks tends to be frequented, whereby cracking is likely to result, and the strength tends to substantially decrease, such being undesirable. This monoclinic phase content is preferably from 30 to 60%, with a view to maintaining the thermal shock resistance and preventing cracking due to phase transfer. Namely, the monolithic phase undergoes a phase transfer to tetragonal phase during sintering at a temperature of at least 1,000° C., whereby the volume is reduced by about 4%, which cancels out the volume expansion due to thermal expansion to increase the thermal shock resistance. Further, the presence of the monoclinic phase serves to form many microcracks in the sintered body, and such microcracks have an effect of preventing the growth of cracking, and thus the presence of monoclinic phase contributes to the improvement of the thermal shock resistance.

The content of tetragonal phase is at most 3%, preferably substantially 0%. The reason is such that if tetragonal phase increases, the solid solubilization of the stabilizer in zirconia progresses, and the composition of the vapor deposition material becomes uniform, and in such a case, the crystal particles tend to be too large under heating by EB irradiation, whereby the thermal shock resistance tends to be low, such being undesirable.

The bulk density is from 3.0 to 5.0 g/cm$^3$. The reason is such that if the bulk density exceeds 5.0 g/cm$^3$, breakage will result due to a thermal stress caused by a local heating during EB irradiation, such being undesirable. On the other hand, if the bulk density is less than 3.0 g/cm$^3$, the mechanical strength decreases, and the handling tends to be difficult, such being undesirable.

The porosity is from 15 to 50%, and the volume of pores of from 0.1 to 5 μm constitutes at least 90%, preferably at least 95%, of the total pore volume.

The reason for limiting the porosity to from 15 to 50% is such that if the porosity is less than 15%, breakage is likely to result due to a thermal stress caused by a local heat expansion during EB irradiation, such being undesirable. On the other hand, if the porosity exceeds 50%, the mechanical strength tends to be low, and the handling will be difficult, such being undesirable.

With respect to the distribution of pores, the volume of pores having pore sizes of from 0.1 to 5 μm constitutes at least 90%. The reason is such that if the amount of pores having small pore sizes is substantial, the pores are likely to diminish by heating during EB irradiation as the sintering progresses, whereby the function of a porous nature will diminish. On the other hand, if the amount of pores having large pore sizes is substantial, the mechanical strength of the vapor deposition material decreases, or the stability of the melt pool of the vapor deposition material tends to be impaired. Further, within the half value range of the pore size distribution curve, the maximum value is preferably at least 0.85 μm. The reason is such that if the maximum value is less than 0.85 μm, even if the volume of pores having pore sizes of from 0.1 to 5 μm constitutes at least 90% of the total pore volume, the amount of pores having small sizes increases as a whole, whereby pores are likely to diminish during heating by EB irradiation, and the thermal shock resistance tends to be inadequate.

Further, the vapor deposition material has a feature that the particle sizes of particles are at most 10 μm, and aggregated particles of at least 20 μm are not contained. If the particle sizes of particles exceed 10 μm, or aggregated particles of at least 20 μm are contained, when a melt pool is to be formed by melting the vapor deposition material by EB irradiation, the vapor deposition material tends to be hardly partially meltable, whereby it tends to be difficult to form a uniform and stabilized melt pool, and the vapor deposition operation tends to be difficult, and the quality of the thermal barrier coating film formed by vapor deposition tends to be low, whereby the durability tends to be low.

For example, when sintering is carried out at 1,400° C., grain growth takes place, and the particle size of the vapor deposition material becomes larger than the particle size of the starting material powder. Even in such a case, the particle size of the vapor deposition material must be at most 10 μm. Further, aggregated particles of at least 20 μm must not be contained in the vapor deposition material due to inadequate dispersion for mixing or due to aggregation of the starting material powder in the dispersing medium. Here, the aggregated particles in the vapor deposition material are meant for those wherein particles are intimately joined together, and the presence or absence of such aggregated particles can be clearly ascertained by a scanning electron microscope.

Further, the present invention provides a method for forming a thin film of zirconia on a substrate of e.g. a metal or ceramic by using the vapor deposition material of the present invention by means of an EB vapor deposition apparatus, and a part of e.g. a metal obtained by this method.

Now, the present invention will be described in detail with reference to the following Examples. However, it should be understood that the present invention is by no means restricted to such specific Examples.

EXAMPLE 1

5 wt % (10 g) of an organic binder was added to 83.6 g of a zirconia powder having an average particle size of 0.5 μm and 6.4 g of an yttria powder having an average particle size of 0.2 μm, and the mixture was mixed in a ball mill (capacity: 1 l, balls: 2.5 kg) for one hour and then dried to obtain a powder, which was packed into a rubber mold (diameter: 35 mm, thickness: 100 mm) and molded by a wet system cold isostatic pressing apparatus (4KB×150D×500L Model, manufactured by Kobe Seiko K.K.) under a pressure of 1 ton/cm$^2$, followed by sintering at 1,420° C. to obtain a vapor deposition material.

EXAMPLE 2

5 wt % (10 g) of an organic binder was added to 83.6 g of a zirconia powder having an average particle size of 0.8 μm and 6.4 g of an yttria powder having an average particle size of 0.2 μm, and the mixture was mixed in a ball mill (capacity: 1 l, balls: 2.5 kg) for one hour and then dried to obtain a powder, which was packed into a rubber mold (diameter: 35 mm, thickness: 100 mm) and molded by a wet system cold isostatic pressing apparatus (4KB×150D×500L Model, manufactured by Kobe Seiko K.K.) under a pressure of 1 ton/cm$^2$, followed by sintering at 1,420° C. to obtain a vapor deposition material.

EXAMPLE 3

5 wt % (10 g) of an organic binder was added to 83.6 g of a zirconia powder having an average particle size of 1.5 μm and 6.4 g of an yttria powder having an average particle size of 0.2 μm, and the mixture was mixed in a ball mill (capacity: 1 l, balls: 2.5 kg) for one hour and then dried to obtain a powder, which was packed into a rubber mold (diameter: 35 mm, thickness: 100 mm) and molded by a wet system cold isostatic pressing apparatus (4KB×150D×500L Model, manufactured by Kobe Seiko K.K.) under a pressure of 1 ton/cm$^2$, followed by sintering at 1,630° C. to obtain a vapor deposition material.

EXAMPLE 4

1,393.6 g of a zirconia powder having an average particle size of 5 μm and 106.4 g of an yttria powder having an average particle size of 2 μm were added and mixed in a ball mill (capacity: 2.5 l, balls: 7.5 kg) for one hour and then dried to obtain a powder, which was packed into a rubber mold (diameter: 35 mm, thickness: 100 mm) and molded by a wet system cold isostatic pressing apparatus (4KB×150D×500L Model, manufactured by Kobe Seiko K.K.) under a pressure of 1 ton/cm$^2$, followed by sintering at 1,490° C. to obtain a vapor deposition material.

COMPARATIVE EXAMPLE 1

5 wt % (10 g) of an organic binder was added to 83.6 g of a zirconia powder having an average particle size of 0.8 μm and 6.4 g of an yttria powder having an average particle size of 0.2 μm, and the mixture was mixed in a ball mill (capacity: 1 l, balls: 2.5 kg) for 16 hours and then dried to obtain a powder, which was packed into a rubber mold (diameter: 35 mm, thickness: 100 mm) and molded by a wet system cold isostatic pressing apparatus (4KB×150D×500L Model, manufactured by Kobe Seiko K.K.) under a pressure of 1 ton/cm$^2$, followed by sintering at 1,350° C. to obtain a vapor deposition material.

COMPARATIVE EXAMPLE 2

5 wt % (10 g) of an organic binder was added to 83.6 g of a zirconia powder having an average particle size of 1.5 μm and 6.4 g of an yttria powder having an average particle size of 0.2 μm, and the mixture was mixed in a ball mill (capacity: 1 l, balls: 2.5 kg) for 16 hours and then dried to obtain a powder, which was packed into a rubber mold (diameter: 35 mm, thickness: 100 mm) and molded by a wet system cold isostatic pressing apparatus (4KB×150D×500L Model, manufactured by Kobe Seiko K.K.) under a pressure of 1 ton/cm$^2$, followed by sintering at 1,350° C. to obtain a vapor deposition material.

COMPARATIVE EXAMPLE 3

100 g of a zirconia powder having 4 mol % of yttria having an average particle size of 0.2 μm solid-solubilized, was packed into a rubber mold (diameter: 35 mm, thickness: 100 mm) and molded by a wet system cold isostatic pressing apparatus (4KB×150D×500L Model, manufactured by Kobe Seiko K.K.) under a pressure of 1 ton/cm$^2$, followed by sintering at 1,350° C. to obtain a vapor deposition material.

COMPARATIVE EXAMPLE 4

A zirconia powder having 4 mol % of yttria having an average particle size of 0.2 μm solid-solubilized, was granulated into granules having an average particle size of from 100 μm, which were calcined at 1,20° C. Then, 5 g of an organic binder was added to 95 g of this powder, and the mixture was pulverized and mixed by a ball mill (capacity: 1 l, balls: 2.5 kg) and dried to obtain a powder, which was packed into a rubber mold (diameter: 35 mm, thickness: 100 mm) and molded by a wet system cold isostatic pressing apparatus (4KB×150D×500L Model, manufactured by Kobe Seiko K.K.) under a pressure of 1 ton/cm², followed by sintering at 1,350° C. to obtain a vapor deposition material.

The porosities (%), the mode sizes (μm) of pores, the pore size distributions (%) of from 0.1 to 5 μm, the half value ranges (μm) of the pore size distribution curves, the monoclinic phase contents (%) and the tetragonal phase contents (%) of the vapor deposition materials obtained Examples 1 to 4 and Comparative Examples 1 to 4 are shown in the following Table 1.

It, c(lll)=Sum of integrated intensities of peaks of tetragonal phase (lll) and cubic phase (lll)

Tetragonal phase (%) =

$$(100 - \text{monoclinic system} (\%)) \times \frac{3It(400)}{3It(400) + 2Ic(400)}$$

Ic(400): Integrated intensity of peaks of cubic phase (400)

It(400): Integrated intensity of peaks of tetragonal phase (400)

Further, irradiation tests using two types of EB with EB powers of 0.27 kw and 5 kw (EB irradiation test 1, measuring conditions: accelerating voltage: 9 kV, current: 30

TABLE 1

|  | Example 1 | Example 2 | Example 3 | Example 4 | Comparative Example 1 | Comparative Example 2 | Comparative Example 3 | Comparative Example 4 |
|---|---|---|---|---|---|---|---|---|
| Monoclinic phase (%) | 55 | 51 | 34 | 40 | 40 | 40 | ≈0 | ≈0 |
| Tetragonal phase (%) | 0 | 0 | 0 | 0 | 0 | 0 | 84 | 83 |
| Bulk density (g/cm³) | 3.6 | 3.9 | 3.5 | 3.8 | 3.6 | 3.5 | 3.6 | 3.7 |
| Porosity (%) | 40 | 35 | 42 | 36 | 41 | 42 | 41 | 39 |
| Pore mode size (μm) | 0.9 | 0.93 | 1.7 | 1.5 | 0.47 | 0.65 | 0.068 | 4.1 |
| Pore distribution of 0.1 to 5 μm (%) | 96.7 | 96.7 | 98.4 | 98.7 | 97.6 | 97.6 | 0 | 88.2 |
| Half value range (μm) | 0.25 to 0.85 | 0.45 to 1.38 | 0.88 to 2.52 | 1.17 to 1.87 | 0.36 to 0.59 | 0.45 to 0.82 | 0.054 to 0.071 | 2.88 to 5.13 |
| Particle size by SEM (μm) | 0.8 | 1.8 | 2.5 | 6 | 1.2 | 2 | 0.1 to 0.2 | 1 to 50 |
| EB irradiation test 1 | Possible | Excellent | Excellent | Excellent | Breakage | Breakage | Breakage | Cracking |
| EB irradiation test 2 | Possible | Good | Excellent | Good | — | — | — | Breakage |

Each values shown in Table 1 were obtained by following methods.

Bulk density: The bulk densities of vapor deposition materials were calculated by the weights of vapor deposition materials having cylindrical shape and shape sizes measured by micrometer.

The porosity, the mode diameter of pores and the pore size distribution were measured by a mercury porosimeter (MIC-9320 model, manufactured by Shimadzu Corporation).

Particle size by SEM (μm):

The particle sizes of powder were obtained by electron-scanning microscope observation of surfaces which were exposed by shaving of molded body of powders and the intercept method.

The particle sizes of vapor deposition materials were obtained similarly by electron-scanning microscope observation of surfaces which were exposed by shaving and the intercept method.

The monoclinic phase content and the cubic phase content were obtained by obtaining diffraction peaks by an X-ray diffraction apparatus (M×p³ VA model, manufactured by Macscience K.K) and calculating by the following calculation formulas 1 and 2.

$$\text{Monoclinic phase content} (\%) = \frac{Im(111) + Im(11\bar{1})}{Im(111) + Im(11\bar{1}) + It, c(111)}$$

Im(lll): Integrated intensity of peaks of monoclinic phase (lll)

Im(ll$\bar{l}$): Integrated intensity of peaks of monoclinic phase (ll$\bar{l}$)

mA, reduced pressure: 1 to 2×10⁻⁶ Torr, EB irradiation test 2, measuring conditions: accelerating voltage: 5 kV, current: 1A) were carried out, whereby presence or absence of formation of cracking of the vapor deposition materials were examined. The results are shown in Table 1. Further, the melt state of the vapor deposition material with EB power of 5 kw was examined. The results are also shown in Table 1.

By the method of the present invention, it is possible to obtain a vapor deposition material for coating which undergoes no cracking even by EB irradiation, and this vapor deposition material is useful, for example, for heat resistant coating for a part of e.g. an aircraft engine.

What is claimed is:

1. A vapor deposition material which is a sintered body of zirconia containing a stabilizer, wherein the content of monoclinic phase is from 25 to 70%, the content of tetragonal phase is at most 3% and the rest is cubic phase, and of which the bulk density is from 3.0 to 5.0 g/cm³, the porosity is from 15 to 50%, the mode size of pores is from 0.5 to 3 μm, and the volume of pores of from 0.1 to 5 μm constitutes at least 90% of the total pore volume.

2. The vapor deposition material according to claim 1, wherein within the half value range of the pore size distribution curve, the maximum value is at least 0.85 μm.

3. The vapor deposition material according to claim 1, wherein the content of tetragonal phase is substantially 0%.

4. The vapor deposition material according to claim 1, wherein the particle sizes are at most 10 μm, and aggregated particles of at least 20 μm are not contained.

* * * * *